United States Patent
Mays

(10) Patent No.: US 9,496,830 B1
(45) Date of Patent: Nov. 15, 2016

(54) THRESHOLD VOLTAGE-TRACKING BIAS CIRCUIT FOR RADIO FREQUENCY POWER AMPLIFIER

(71) Applicant: TriQuint Semiconductor, Inc., Hillsboro, OR (US)

(72) Inventor: Kenneth W. Mays, Tigard, OR (US)

(73) Assignee: Qorvo US, Inc., Greensboro, NC (US)

( * ) Notice: Subject to any disclaimer, the term of this patent is extended or adjusted under 35 U.S.C. 154(b) by 17 days.

(21) Appl. No.: 14/095,890

(22) Filed: Dec. 3, 2013

(51) Int. Cl.
*H03F 3/04* (2006.01)
*H03F 3/19* (2006.01)

(52) U.S. Cl.
CPC ....................................... *H03F 3/19* (2013.01)

(58) Field of Classification Search
CPC .............. H03F 3/04; H03F 3/20; H03G 3/30
USPC .................................................. 330/296, 285
See application file for complete search history.

(56) References Cited

U.S. PATENT DOCUMENTS

| | | | | |
|---|---|---|---|---|
| 7,304,541 | B2 * | 12/2007 | Baree et al. .................. | 330/296 |
| 7,417,507 | B2 * | 8/2008 | Yamamoto et al. .......... | 330/296 |
| 7,522,001 | B2 * | 4/2009 | Yamamoto et al. .......... | 330/285 |
| 7,576,612 | B2 * | 8/2009 | Nakamura et al. ........... | 330/296 |
| 7,671,682 | B2 * | 3/2010 | Kuroda ......................... | 330/289 |
| 7,688,133 | B2 * | 3/2010 | Yamamoto et al. ............ | 330/51 |
| 7,728,672 | B2 * | 6/2010 | Choi et al. .................... | 330/296 |
| 7,936,219 | B2 * | 5/2011 | Matsuzuka ........... | H03F 1/0261 |
| | | | | 330/285 |

OTHER PUBLICATIONS

Trantanella et al.; "pHEMT Amplifier MMICs with Enhanced Robustness Against Process Variations"; IMS2011 Baltimore; 2011.

* cited by examiner

*Primary Examiner* — Henry Choe
(74) *Attorney, Agent, or Firm* — Withrow & Terranova, P.L.L.C.

(57) ABSTRACT

Various embodiments provide a radio frequency (RF) power amplifier (PA) circuit including an RF PA and a bias circuit. The bias circuit may provide a direct current (DC) bias voltage to the RF PA. The bias circuit may include a bias transistor, and the RF PA may include an amplifier transistor. The bias circuit may further include a diode coupled between a gate terminal of the amplifier transistor and a drain terminal of the bias transistor to pass the DC bias voltage to the gate terminal of the amplifier transistor and to level-shift the DC bias voltage at the gate terminal of the amplifier transistor to be higher than a DC voltage level at the drain terminal of the bias transistor.

10 Claims, 4 Drawing Sheets

THRESHOLD VOLTAGE-TRACKING BIAS CIRCUIT FOR RADIO FREQUENCY POWER AMPLIFIER

FIELD

Embodiments of the present disclosure relate generally to the field of circuits, and more particularly to bias circuits for radio frequency power amplifiers.

BACKGROUND

In radio frequency (RF) power amplifiers, a bias circuit is often included to provide a direct current (DC) bias voltage to an amplifying transistor of the RF power amplifier. However, the threshold voltage (also referred to as pinch-off voltage) of the amplifying transistor may vary across different RF power amplifiers. The varied threshold voltage, in turn, causes variance in the drain current of the amplifying transistor.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Various embodiments may provide a radio frequency (RF) power amplifier (PA) circuit including an RF PA and a bias circuit. The bias circuit may provide a direct current (DC) bias voltage to the RF PA. The bias circuit may include a bias transistor having a gate terminal, a drain terminal, and a source terminal, and the RF PA may include an amplifier transistor having a gate terminal, a drain terminal, and a source terminal. The bias circuit may further include a diode coupled between the gate terminal of the amplifier transistor and the drain terminal of the bias transistor to level-shift the DC bias voltage to a higher voltage and to pass the level-shifted DC bias voltage to the gate terminal of the amplifier transistor. Thus, the DC voltage level at the gate terminal of the amplifier transistor may be higher than the DC voltage level at the drain terminal of the bias transistor.

Figure 1:
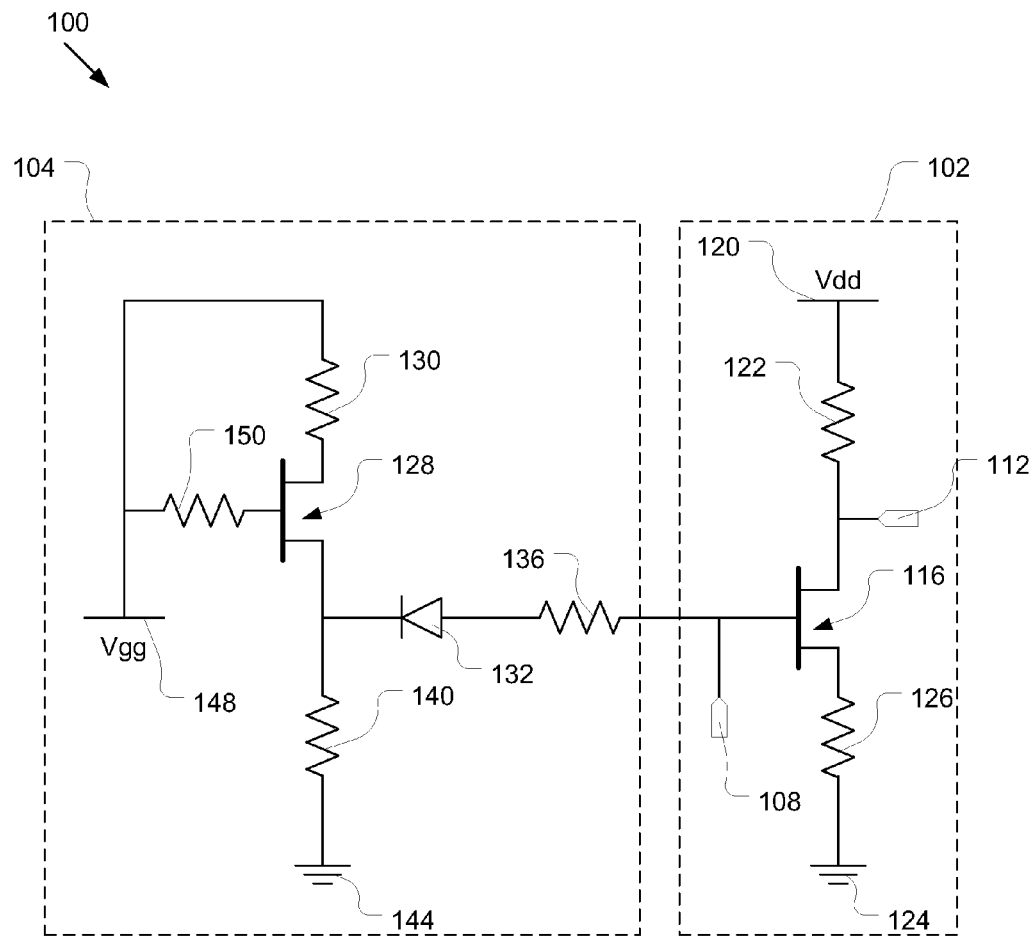
FIG. 1 illustrates a circuit diagram of a radio frequency (RF) power amplifier (PA) circuit including an RF PA and a bias circuit in accordance with various embodiments.

FIG. 1 illustrates an RF PA circuit 100 in accordance with various embodiments. The RF PA circuit 100 may include an RF PA 102 and a bias circuit 104 coupled with the RF PA 102. The RF PA 102 may receive an RF input signal RFin at an input terminal 108 and produce an amplified RF output signal RFout at an output terminal 112. The RF PA 102 may be used, for example, to amplify RFin for transmission over a wireless communications network.

In various embodiments, the RF PA 102 may include an amplifier transistor 116. In some embodiments, the RF PA 102 may be a complementary metal-oxide-semiconductor (CMOS) amplifier. For example, in some embodiments, the amplifier transistor 116 may be a field-effect transistor (FET), such as an n-type or p-type FET. In other embodiments, the RF PA 102 may be another type of amplifier, and/or the amplifier transistor 116 may be another type of transistor.

The amplifier transistor 116 may include a gate terminal, a source terminal, and a drain terminal. The gate terminal of the amplifier transistor 116 may be coupled with the input terminal 108 of RF PA 102 to receive the RF input signal. The drain terminal of the amplifier transistor 116 may be coupled with the output terminal 112 to provide the RF output signal. The drain terminal of the amplifier transistor 116 may be further coupled with a DC supply rail 120 (e.g., via a resistor 122) to provide a DC supply voltage Vdd. In some embodiments, the source terminal of the amplifier transistor 116 may be coupled with a ground potential 124 (e.g., via a resistor 126).

In some embodiments, the RF PA 102 may include other transistors, in addition to the amplifier transistor 116, coupled between the input terminal 108 and the output terminal 112. For example, the RF PA 102 may be a stacked amplifier, with another transistor (not shown) coupled in series with the amplifier transistor 116 and between the amplifier transistor 116 and the output terminal 112 (e.g., with the source terminal of the other transistor coupled with the drain terminal of the amplifier transistor 116). Alternatively, or additionally, the RF PA 102 may have a plurality of amplifier stages, and the amplifier transistor 116 may be included in one of the plurality of amplifier stages.

In some embodiments, the RF PA circuit 100 may further include a matching network (not shown) coupled to the input terminal 108 and/or output terminal 112 for impedance matching with other components (e.g., of a wireless communication device).

In various embodiments, the bias circuit 104 may be coupled with the gate terminal of the amplifier transistor 116 to provide a DC bias voltage to the amplifier transistor 116 and/or RF PA 102. For example, the DC bias voltage may bias the RF PA 102 and/or amplifier transistor 116 in an amplifying mode.

The bias circuit 104 may include a bias transistor 128 with a gate terminal, a drain terminal, and a source terminal. The source terminal of the bias transistor 128 may be coupled with the gate terminal of the bias transistor 128 (e.g., via a resistor 130). In some embodiments, the bias transistor 128 may be a FET, such as an n-type or p-type FET.

In various embodiments, the bias circuit 104 may further include a diode 132 coupled between the gate terminal of the amplifier transistor 116 and the drain terminal of the bias transistor 128. In some embodiments, the diode 132 may be a Shottky diode or a diode-connected transistor. A forward terminal of the diode 132 may be oriented toward the drain terminal of the bias transistor 128. The diode 132 may pass the DC bias voltage to the gate terminal of the amplifier transistor 116. Additionally, the diode 132 may level-shift the DC bias voltage at the gate terminal of the amplifier transistor 116 to be higher than a DC voltage level at the drain terminal of the bias transistor 128. The higher DC voltage level at the gate terminal of the amplifier transistor 116 may reduce a variation in the drain current of the amplifier transistor 116 over a change in the DC bias voltage at the gate terminal of the amplifier transistor 116, as further discussed below.

In various embodiments, the bias circuit 104 may further include a bias resistor 136 coupled in series with the diode 132 between the gate terminal of the amplifier transistor 116 and the drain terminal of the bias transistor 128. In some embodiments, the bias resistor 136 may be coupled between the diode 132 and the gate terminal of the amplifier transistor 116. In other embodiments, the bias resistor 136 may be coupled between the diode 132 and the drain terminal of the bias transistor 128.

In some embodiments, the bias circuit 104 may further include a resistor 140 coupled between the drain terminal of the bias transistor 128 and a ground terminal 144. In various embodiments, the bias circuit 104 may further include a supply terminal 148 coupled with the gate terminal of the bias transistor 128 to provide a DC supply voltage Vgg. In some embodiments, the DC supply voltage Vgg may be a negative voltage.

In some embodiments, the bias circuit 104 may include an electro-static discharge (ESD) resistor 150 coupled with the gate terminal of the bias transistor 128 (e.g., via the gate terminal of the bias transistor 128 and the supply terminal 148). The ESD resistor 150 may protect the bias transistor 128 and/or other components of the RF PA circuit 100 from an ESD event. Other embodiments of the bias circuit 104 may not include the ESD resistor 150.

In various embodiments, the bias circuit 104 may adjust the voltage level of DC bias voltage provided to the gate terminal of the amplifier transistor 116 based on the threshold voltage of the amplifier transistor 116. In some cases, the threshold voltage may also be referred to as the pinch-off voltage. In embodiments in which the amplifier transistor 116 is a depletion mode transistor, the threshold voltage may correspond to a voltage level at the gate terminal of the amplifier transistor 116 below which the amplifier transistor 116 is on and above which the amplifier transistor 116 is off. In embodiments in which the amplifier transistor 116 is an enhancement mode transistor, the threshold voltage may correspond to a voltage level at the gate terminal of the amplifier transistor 116 below which the amplifier transistor 116 is off and above which the amplifier transistor 116 is on.

The threshold voltage of the amplifier transistor 116 may vary (e.g., between different units of the RF PA module 100 and/or across process, voltage, and/or temperature conditions). As the threshold voltage changes, the voltage level of the DC bias voltage provided by the bias circuit 104 may change. For example, for a depletion mode amplifier transistor 116, as the threshold voltage of the amplifier transistor 116 becomes more negative, the bias transistor 128 may draw more current. The increased current across the bias resistor 136 may cause the voltage level of the DC bias voltage at the gate terminal of the amplifier transistor 116 to become more negative. The lower DC bias voltage causes the bias transistor 128 to draw less current compared with a fixed DC bias voltage. Accordingly, the bias circuit 104 adjusts the voltage level of the DC bias voltage based on the threshold voltage of the amplifier transistor 116.

In various embodiments, the drain current of the amplifier transistor 116 may also vary with the threshold voltage of the amplifier transistor 116. The adjustment of the voltage level of the DC bias voltage by the bias circuit 104 reduces the amount that the drain current of the amplifier transistor 116 varies compared with an amplifier transistor with a fixed DC bias voltage. However the drain current of the amplifier transistor 116 may still vary significantly with the threshold voltage of the amplifier transistor 116. The level-shifting by the diode 136 further reduces the amount that the drain current of the amplifier transistor 116 varies with the threshold voltage of the amplifier transistor 116. The increased voltage level of the DC bias voltage provided by the bias circuit 104 shifts the amplifier transistor 116 to an operating region in which the drain current varies less with the gate voltage compared with a lower DC bias voltage.

Figure 2:
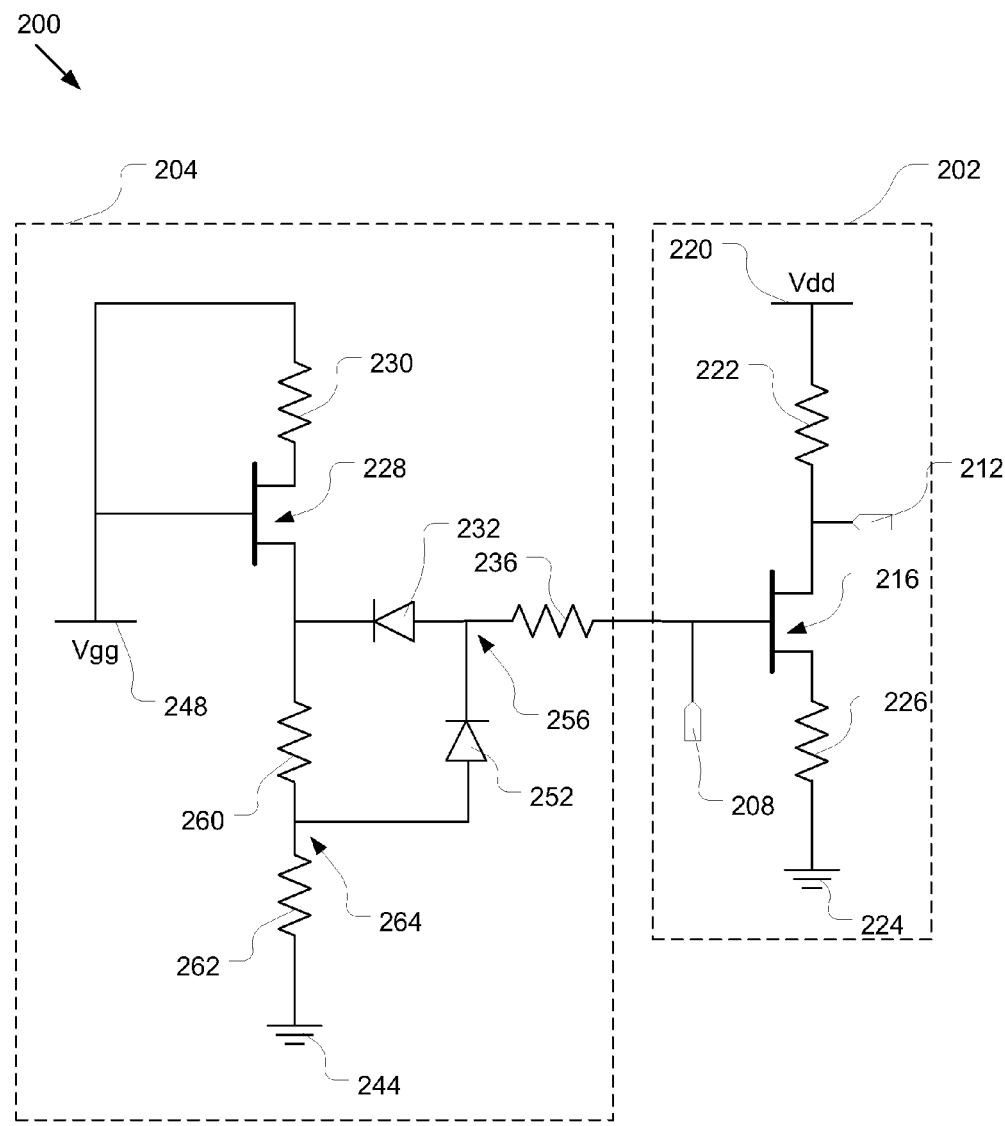
FIG. 2 illustrates an alternative configuration of an RF PA circuit in accordance with various embodiments.

FIG. 2 illustrates another embodiment of an RF PA circuit 200, including an RF PA 202 and a bias circuit 204, in which the bias circuit 204 includes a first diode 232 to level-shift the DC bias voltage and a second diode 252 to provide current to the first diode 232. The first diode 232 may be coupled between the drain terminal of a bias transistor 228 and the gate terminal of an amplifier transistor 216 (e.g., in series with a bias resistor 236), similar to the diode 132 of RF PA circuit 100. The second diode 252 may have a forward terminal coupled with a node 256 between the first diode 232 and the gate terminal of the amplifier transistor 216.

In some embodiments, a reverse terminal of the second diode 252 may be coupled with the drain terminal of the bias transistor 228. In some embodiments, the bias circuit 204 may include a first resistor 260 and a second resistor 262 coupled in series between the drain terminal of the bias transistor 228 and a ground terminal 244. In some embodiments, the reverse terminal of the second diode may be coupled with a node 264 between the first resistor 260 and second resistor 262. The resistors 260 and 262 may provide a desired voltage at the node 264 to facilitate operation of the second diode 252. For example, the voltage potential at the node 264 may be higher than the voltage potential at node 256 so that the diode 252 is in a forward-conducting state. Accordingly, the second diode 252 may pass current from the node 264 (e.g., leakage current) to the node 256. The current may facilitate keeping the first diode 232 on (e.g., conducting current in the forward direction) to pass and level-shift the DC bias voltage.

The RF PA circuit 200 may further include an RF input terminal 208, an RF output terminal 212, resistors 222, 226, and 230, ground terminal 224, supply rail 220, and/or supply terminal 248.

Referring again to FIG. 1, in some embodiments, the DC voltage level of the supply voltage Vgg at the supply terminal 148 may be varied to change a gate voltage on the gate terminal of the bias transistor 128. The changed gate voltage on the gate terminal of the bias transistor 128 may change the bias point of the amplifier transistor 116. A manufacturer of a device that employs the RF PA module 100 may change the supply voltage Vgg to change the bias point of the amplifier transistor 116 based on the particular application of the RF PA module 100.

For example, adjusting the supply voltage Vgg may adjust the DC voltage at the drain terminal of the bias transistor 128, which in turn adjusts the DC bias voltage at the gate terminal of the amplifier transistor 116. The DC bias voltage at the gate terminal of the amplifier transistor 116 may be adjusted, for example, to increase the gain of the amplifier transistor 116 or to lower the gain and improve noise performance of the amplifier transistor 116. In some embodiments, the supply voltage Vgg may be dynamically adjusted, which may improve the power added efficiency of the RF PA 102.

In some embodiments, a potentiometer, a variable DC power supply, and/or a variable current source (not shown) may be coupled with the supply terminal 148 to change the DC voltage level of the supply voltage Vgg.

Figure 3:
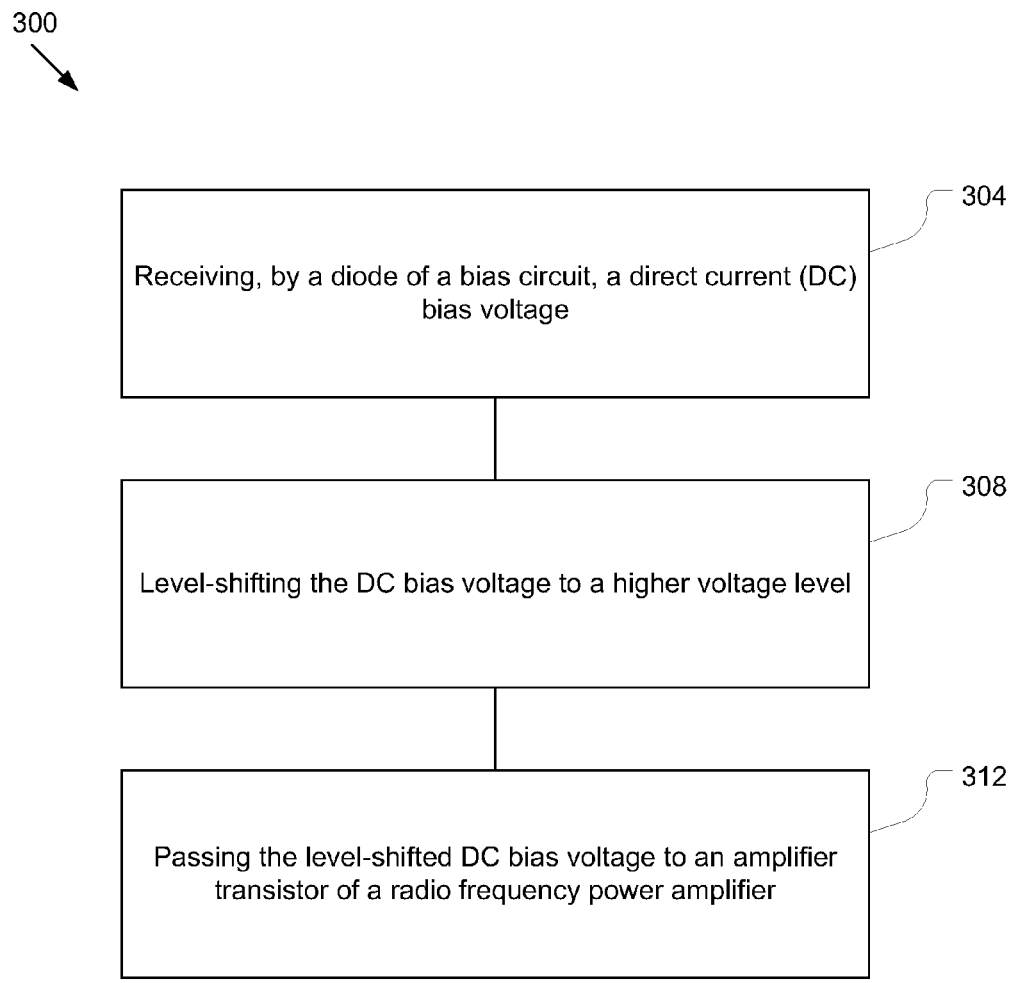
FIG. 3 illustrates method to be performed by a bias circuit in accordance with various embodiments.

FIG. 3 illustrates a method 300 that may be performed by a bias circuit (e.g., bias circuit 100 and/or 200) in accordance with various embodiments. At block 304, the method 300 may include receiving, by a diode of the bias circuit, a DC bias voltage. The DC bias voltage may be received, for example, from a bias transistor (e.g., bias transistor 128 or 228).

At block 308, the method 300 may include level-shifting the DC bias voltage to a higher voltage level. At block 312, the method 300 may include passing the level-shifted DC bias voltage to an amplifier transistor (e.g., amplifier transistor 116 or 216) of an RF PA (e.g., RF PA 102 or 202).

Figure 4:
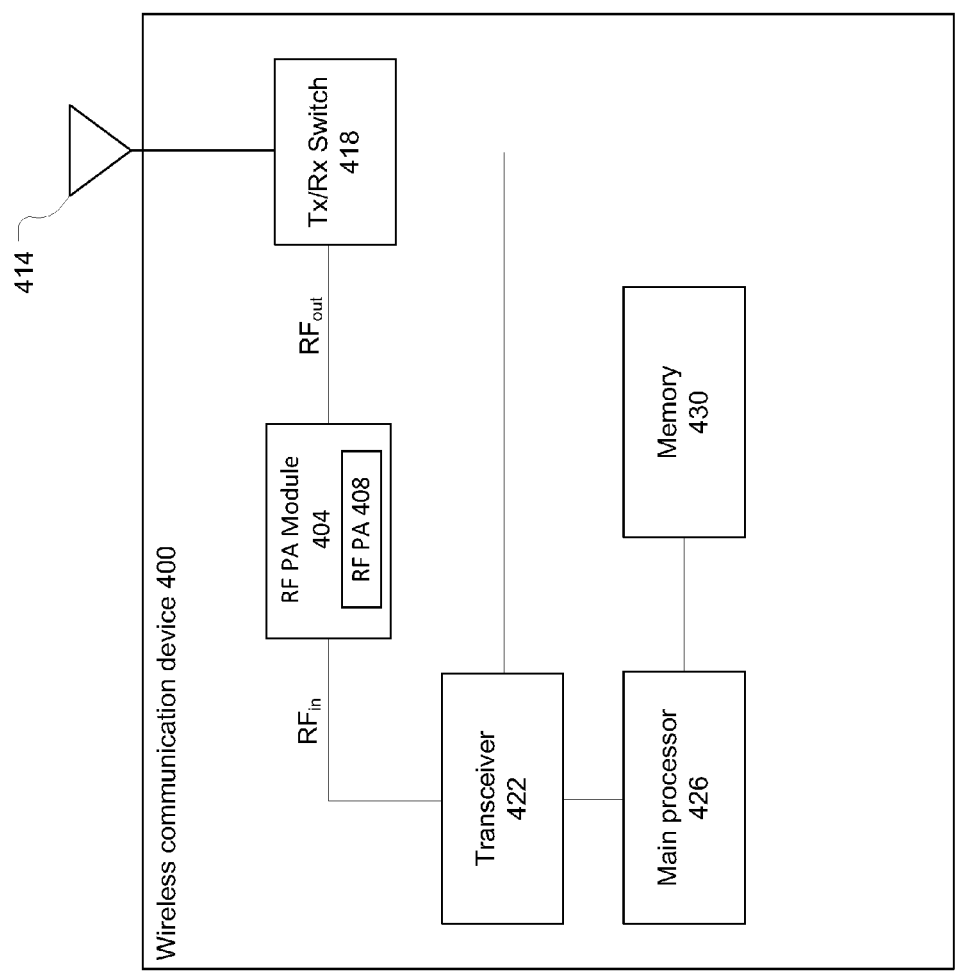
FIG. 4 is a block diagram of an exemplary wireless communication device in accordance with various embodiments.

A block diagram of an exemplary wireless communication device 400 is illustrated in FIG. 4 in accordance with some embodiments. Wireless communication device 400 may have a RF PA module 404 including one or more RF PA circuits 408, which may be similar to RF PA circuit 100, 200, and/or 300. In addition to the RF PA module 404, the wireless communication device 400 may have an antenna structure 414, a Tx/Rx switch 418, a transceiver 422, a main processor 426, and a memory 430 coupled with each other at least as shown. While the wireless communication device 400 is shown with transmitting and receiving capabilities, other embodiments may include devices with only transmitting or only receiving capabilities.

In various embodiments, the wireless communication device 400 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 426 may execute a basic operating system program, stored in the memory 430, in order to control the overall operation of the wireless communication device 400. For example, the main processor 426 may control the reception of signals and the transmission of signals by transceiver 422. The main processor 426 may be capable of executing other processes and programs resident in the memory 430 and may move data into or out of memory 430, as desired by an executing process.

The transceiver 422 may receive outgoing data (e.g., voice data, web data, e-mail, signaling data, etc.) from the main processor 426, may generate the $RF_{in}$ signal(s) to represent the outgoing data, and provide the $RF_{in}$ signal(s) to the RF PA module 404. The transceiver 422 may also control the RF PA module 404 to operate in selected bands and in either full-power or backoff-power modes. In some embodiments, the transceiver 422 may generate the $RF_{in}$ signal(s) using OFDM modulation.

The RF PA module 404 may amplify the $RF_{in}$ signal(s) to provide $RF_{out}$ signal(s) as described herein. The $RF_{out}$ signal (s) may be forwarded to the Tx/Rx switch 418 and then to the antenna structure 414 for an over-the-air (OTA) transmission. In some embodiments, Tx/Rx switch 418 may include a duplexer.

In a similar manner, the transceiver 422 may receive an incoming OTA signal from the antenna structure 414 through the Tx/Rx switch 418. The transceiver 422 may process and send the incoming signal to the main processor 426 for further processing.

In various embodiments, the antenna structure 414 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 400 is given by way of example and that, for simplicity and clarity, only so much of the construction and operation of the wireless communication device 400 as is necessary for an understanding of the embodiments is shown and described. Various embodiments contemplate any suitable component or combination of components performing any suitable tasks in association with wireless communication device 400, according to particular needs. Moreover, it is understood that the wireless communication device 400 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
   an amplifier transistor to receive a radio frequency (RF) input signal at a gate terminal of the amplifier transistor and to amplify the RF input signal; and
   a bias circuit to generate a direct current (DC) bias voltage and including
      a bias transistor having a drain terminal;
      a diode having a reverse terminal coupled to the gate terminal of the amplifier transistor and a forward terminal coupled to the drain terminal of the bias transistor to pass the DC bias voltage to the gate terminal of the amplifier transistor and to level-shift the DC bias voltage at the gate terminal of the amplifier transistor to be higher than a DC voltage level at the drain terminal of the bias transistor;
a first resistor coupled between a ground potential and the forward terminal of the diode;
an electro-static discharge (ESD) resistor coupled between a gate terminal of the bias transistor and a supply terminal that supplies a negative voltage; and
a second resistor coupled between a source terminal of the bias transistor and the supply terminal.

2. The circuit of claim 1, further comprising a bias resistor coupled in series with the diode between the gate terminal of the amplifier transistor and the drain terminal of the bias transistor.

3. A circuit comprising:
an amplifier transistor to receive a radio frequency (RF) input signal at a gate terminal of the amplifier transistor and to amplify the RF input signal; and
a bias circuit to generate a direct current (DC) bias voltage and including
a bias transistor having a drain terminal;
a first diode having a reverse terminal coupled to the gate terminal of the amplifier transistor and a forward terminal coupled to the drain terminal of the bias transistor to pass the DC bias voltage to the gate terminal of the amplifier transistor and to level-shift the DC bias voltage at the gate terminal of the amplifier transistor to be higher than a DC voltage level at the drain terminal of the bias transistor; and
a second diode having a forward terminal coupled with a node between the first diode and the gate terminal of the amplifier transistor to provide current to the first diode.

4. The circuit of claim 3, wherein the bias circuit further comprises;
first and second resistors coupled in series with one another between the drain terminal of the bias transistor and a ground potential, wherein a reverse terminal of the second diode is coupled with a node between the first and second resistors.

5. An apparatus comprising:
a radio frequency (RF) transistor including a gate terminal, the RF transistor to receive an RF signal at the gate terminal; and
a bias circuit to provide a direct current (DC) bias voltage at the gate terminal of the RF transistor, wherein the bias circuit is to adjust the DC bias voltage based on a threshold voltage of the R F transistor, including;
a bias transistor having a drain terminal;

a diode having a forward terminal coupled to the bias transistor and a reverse terminal coupled to the gate terminal of the RF transistor to level-shift a voltage level of the DC bias voltage to reduce a variation in drain current of the RF transistor over a change in the DC bias voltage at the gate terminal of the RF transistor;
a first resistor coupled between a node and a ground potential and the forward terminal of the diode;
an electro-static discharge (ESD) resistor coupled between a gate terminal of the bias transistor and a supply terminal that supplies a negative voltage; and
a second resistor coupled between a source terminal of the bias transistor and the supply terminal.

6. The apparatus of claim 5, further comprising a bias resistor coupled in series with the diode between the gate terminal of the RF transistor and the drain terminal of the bias transistor.

7. An apparatus comprising:
a radio frequency (RF) transistor including a gate terminal, the RF transistor to receive an RF signal at the gate terminal; and
a bias circuit to provide a direct current (DC) bias voltage at the gate terminal of the RF transistor, wherein the bias circuit is to adjust the DC bias voltage based on a threshold voltage of the RF transistor, including
a bias transistor having a drain terminal;
a first diode having a forward terminal coupled to the bias transistor and a reverse terminal coupled to the gate terminal of the RF transistor to level-shift a voltage level of the DC bias voltage to reduce a variation in drain current of the RF transistor over a change in the DC bias voltage at the gate terminal of the RF transistor;
first and second resistors coupled in series with one another between the drain terminal of the bias transistor and a ground potential; and
a second diode having a forward terminal coupled with a node between the first diode and the gate terminal of the R F transistor and a reverse terminal coupled with a node between the first and second resistors, the second diode to provide current to the first diode.

8. The apparatus of claim 5, wherein the RF transistor is to amplify the RF signal.

9. The circuit of claim 3, further comprising a bias resistor coupled in series with the first diode between the gate terminal of the amplifier transistor and the drain terminal of the bias transistor.

10. The apparatus of claim 7, further comprising a bias resistor coupled in series with the first diode between the gate terminal of the RF transistor and the drain terminal of the bias transistor.

* * * * *